US012408312B2

(12) United States Patent
Brown

(10) Patent No.: US 12,408,312 B2
(45) Date of Patent: Sep. 2, 2025

(54) DISPLAY ASSEMBLIES WITH VENTS

(71) Applicant: Manufacturing Resources International, Inc., Alpharetta, GA (US)

(72) Inventor: Mike Brown, Cumming, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 335 days.

(21) Appl. No.: 17/872,441

(22) Filed: Jul. 25, 2022

(65) Prior Publication Data

US 2023/0032626 A1 Feb. 2, 2023

Related U.S. Application Data

(60) Provisional application No. 63/226,314, filed on Jul. 28, 2021.

(51) Int. Cl.
*G06F 1/16* (2006.01)
*H05K 5/00* (2025.01)
(Continued)

(52) U.S. Cl.
CPC ....... *H05K 7/20972* (2013.01); *H05K 5/0214* (2022.08); *H05K 7/20145* (2013.01); *G06F 1/203* (2013.01)

(58) Field of Classification Search
CPC .... G06F 1/1601; G06F 1/1616; G06F 1/1618; G06F 1/162; G06F 1/1622; G06F 1/1624; G06F 1/1628; G06F 1/163; G06F 1/1633; G06F 1/169; G06F 1/1643; G06F 1/20; G06F 1/203; G06F 1/206; H05K 7/20972; H05K 5/0214; H05K 7/20145; G02F 1/133382
See application file for complete search history.

(56) References Cited

U.S. PATENT DOCUMENTS 4,093,355 A 6/1978 Kaplit et al.
4,292,370 A 9/1981 Pekko
(Continued)

FOREIGN PATENT DOCUMENTS

AU 2011248190 B2 5/2011
AU 2014287438 B2 1/2018
(Continued)

OTHER PUBLICATIONS

Mentley, David E., State of Flat-Panel Display Technology and Future Trends, Proceedings of the IEEE, Apr. 2002, vol. 90, No. 4, pp. 453-459.
(Continued)

*Primary Examiner* — Anthony M Haughton
(74) *Attorney, Agent, or Firm* — Standley Law Group LLP; Jeffrey S. Standley; Adam J. Smith

(57) ABSTRACT

An electronic display assembly with ventilation, and systems and methods related to the same are provided. The electronic display assembly includes an electronic display layer, a closed loop airflow pathway, and one or more vents fluidly interposed between the closed loop airflow pathway and an ambient environment. A controller may control the vents selectively and individually between an open state and a closed state.

20 Claims, 8 Drawing Sheets

(51) Int. Cl.
  *H05K 5/02* (2006.01)
  *H05K 7/00* (2006.01)
  *H05K 7/20* (2006.01)
  *G06F 1/20* (2006.01)

(56) References Cited

U.S. PATENT DOCUMENTS

| | | |
|---|---|---|
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith Stephen W. et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |

(56) References Cited

U.S. PATENT DOCUMENTS

| | | |
|---|---|---|
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2* | 11/2019 | Dunn .................. G02F 1/13338 |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshida |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |

(56) References Cited

U.S. PATENT DOCUMENTS

| | | |
|---|---|---|
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0165496 A1 | 7/2008 | Kang et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Punn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ................ H05K 7/20972 361/695 |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1* | 5/2012 | Hubbard ........... G02F 1/133308 361/696 |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |

(56) References Cited

U.S. PATENT DOCUMENTS

| | | | |
|---|---|---|---|
| 2013/0279154 A1* | 10/2013 | Dunn | F21V 29/67 362/97.3 |
| 2013/0294039 A1 | 11/2013 | Chao | |
| 2013/0344794 A1 | 12/2013 | Shaw et al. | |
| 2014/0044147 A1 | 2/2014 | Wyatt et al. | |
| 2014/0085564 A1 | 3/2014 | Hendren et al. | |
| 2014/0111758 A1 | 4/2014 | Dunn et al. | |
| 2014/0113540 A1 | 4/2014 | Dunn et al. | |
| 2014/0134767 A1 | 5/2014 | Ishida et al. | |
| 2014/0184980 A1 | 7/2014 | Onoue | |
| 2014/0190240 A1 | 7/2014 | He et al. | |
| 2014/0268657 A1 | 9/2014 | Dunn et al. | |
| 2014/0313452 A1 | 10/2014 | Dunn et al. | |
| 2014/0313666 A1 | 10/2014 | Chin | |
| 2014/0313698 A1 | 10/2014 | Dunn et al. | |
| 2014/0314395 A1 | 10/2014 | Dunn et al. | |
| 2014/0334100 A1 | 11/2014 | Yoon et al. | |
| 2014/0361138 A1 | 12/2014 | Ramirez et al. | |
| 2015/0009625 A1 | 1/2015 | Chin et al. | |
| 2015/0009627 A1 | 1/2015 | Dunn et al. | |
| 2015/0087404 A1 | 3/2015 | Lesley et al. | |
| 2015/0192371 A1 | 7/2015 | Hancock | |
| 2015/0253611 A1 | 9/2015 | Yang et al. | |
| 2015/0264826 A1 | 9/2015 | Dunn et al. | |
| 2015/0319882 A1 | 11/2015 | Dunn et al. | |
| 2015/0366101 A1 | 12/2015 | Dunn et al. | |
| 2016/0041423 A1 | 2/2016 | Dunn | |
| 2016/0044829 A1 | 2/2016 | Dunn | |
| 2016/0162297 A1 | 6/2016 | Shao | |
| 2016/0192536 A1 | 6/2016 | Diaz | |
| 2016/0195254 A1 | 7/2016 | Dunn et al. | |
| 2016/0198588 A1 | 7/2016 | DeMars | |
| 2016/0238876 A1 | 8/2016 | Dunn et al. | |
| 2016/0242329 A1 | 8/2016 | DeMars | |
| 2016/0242330 A1 | 8/2016 | Dunn | |
| 2016/0249493 A1 | 8/2016 | Dunn et al. | |
| 2016/0265759 A1 | 9/2016 | Na et al. | |
| 2016/0302331 A1 | 10/2016 | Dunn | |
| 2017/0023823 A1 | 1/2017 | Dunn et al. | |
| 2017/0068042 A1 | 3/2017 | Dunn et al. | |
| 2017/0074453 A1 | 3/2017 | Bowers et al. | |
| 2017/0083043 A1 | 3/2017 | Bowers et al. | |
| 2017/0083062 A1 | 3/2017 | Bowers et al. | |
| 2017/0111486 A1 | 4/2017 | Bowers et al. | |
| 2017/0111520 A1 | 4/2017 | Bowers et al. | |
| 2017/0111521 A1 | 4/2017 | Bowers et al. | |
| 2017/0127579 A1 | 5/2017 | Hubbard | |
| 2017/0140344 A1 | 5/2017 | Bowers et al. | |
| 2017/0147992 A1 | 5/2017 | Bowers et al. | |
| 2017/0163519 A1 | 6/2017 | Bowers et al. | |
| 2017/0172016 A1 | 6/2017 | Kang | |
| 2017/0175411 A1 | 6/2017 | Bowers et al. | |
| 2017/0188490 A1 | 6/2017 | Dunn et al. | |
| 2017/0231112 A1 | 8/2017 | Dunn et al. | |
| 2017/0245400 A1 | 8/2017 | Dunn et al. | |
| 2017/0257978 A1 | 9/2017 | Diaz | |
| 2017/0332523 A1 | 11/2017 | DeMars | |
| 2017/0345346 A1 | 11/2017 | Hong et al. | |
| 2018/0020579 A1 | 1/2018 | Chang et al. | |
| 2018/0042134 A1 | 2/2018 | Dunn et al. | |
| 2018/0088368 A1 | 3/2018 | Notoshi et al. | |
| 2018/0088398 A1 | 3/2018 | Lee et al. | |
| 2018/0116073 A1 | 4/2018 | Dunn | |
| 2018/0199450 A1 | 7/2018 | Kim et al. | |
| 2018/0259806 A1 | 9/2018 | Oh et al. | |
| 2018/0263142 A1* | 9/2018 | Oh | H05K 7/20972 |
| 2018/0314103 A1 | 11/2018 | Dunn et al. | |
| 2018/0315356 A1 | 11/2018 | Dunn et al. | |
| 2018/0317330 A1 | 11/2018 | Dunn et al. | |
| 2018/0317350 A1 | 11/2018 | Dunn et al. | |
| 2018/0364519 A1 | 12/2018 | Dunn et al. | |
| 2019/0021189 A1 | 1/2019 | Kim et al. | |
| 2019/0037738 A1 | 1/2019 | Dunn et al. | |
| 2019/0089176 A1 | 3/2019 | Dunn et al. | |
| 2019/0133002 A1 | 5/2019 | Dunn et al. | |
| 2019/0159363 A1 | 5/2019 | Jang et al. | |
| 2019/0208674 A1 | 7/2019 | Demars | |
| 2019/0239365 A1 | 8/2019 | Dunn et al. | |
| 2019/0289754 A1 | 9/2019 | Hubbard | |
| 2019/0327865 A1 | 10/2019 | Dunn et al. | |
| 2020/0154597 A1 | 5/2020 | Dunn et al. | |
| 2020/0163235 A1 | 5/2020 | Dunn | |
| 2020/0201402 A1 | 6/2020 | Lee et al. | |
| 2020/0205303 A1 | 6/2020 | Dunn et al. | |
| 2020/0253095 A1 | 8/2020 | Dunn et al. | |
| 2020/0275585 A1 | 8/2020 | Dunn | |
| 2020/0288585 A1 | 9/2020 | Dunn et al. | |
| 2020/0319676 A1 | 10/2020 | Dunn | |
| 2020/0352049 A1 | 11/2020 | Dunn et al. | |
| 2020/0367391 A1 | 11/2020 | Dunn | |
| 2020/0387194 A1 | 12/2020 | Dunn | |
| 2020/0390009 A1* | 12/2020 | Whitehead | G09F 9/3026 |
| 2021/0007241 A1 | 1/2021 | Diaz | |
| 2021/0022273 A1 | 1/2021 | Hubbard | |
| 2021/0165472 A1 | 6/2021 | Chin | |
| 2021/0168949 A1 | 6/2021 | Dunn et al. | |
| 2021/0231998 A1 | 7/2021 | Noso et al. | |
| 2021/0243906 A1 | 8/2021 | Dunn | |
| 2021/0243914 A1 | 8/2021 | Dunn | |
| 2021/0304644 A1 | 9/2021 | Webster | |
| 2021/0307214 A1 | 9/2021 | Zhang et al. | |
| 2021/0345528 A1 | 11/2021 | Dunn | |
| 2022/0035198 A1 | 2/2022 | Dunn et al. | |
| 2022/0110227 A1 | 4/2022 | Brown | |
| 2022/0121255 A1 | 4/2022 | Wang et al. | |
| 2022/0132707 A1 | 4/2022 | Dunn et al. | |
| 2022/0287200 A1 | 9/2022 | Dunn et al. | |

FOREIGN PATENT DOCUMENTS

| | | |
|---|---|---|
| AU | 2015253128 B2 | 3/2018 |
| AU | 2017216500 B2 | 10/2018 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 27982777 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |

(56) References Cited

FOREIGN PATENT DOCUMENTS

| | | |
|---|---|---|
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-55567 A | 2/1996 |
| JP | 8115788 A | 5/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | 11160727 A | 6/1999 |
| JP | H11296094 A | 10/1999 |
| JP | 2000-10501 A | 1/2000 |
| JP | 2000131682 A | 5/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2007003638 A | 1/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | IP6824440 B2 | 1/2021 |
| JP | 6858276 B2 | 3/2021 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 10-2007-0048300 A | 5/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. V Manufacturing Resources International, Inc.*, Defendant's Amended Answer and Counterclaims to Plaintiff's First Amended Complaint, Filed Apr. 24, 2018, 240 pages.
Amphenol Corporation, homepage, https://www.amphenol.com/, accessed Oct. 12, 2022, 2022, 3 pages.
W. L. Gore & Associates, Inc., Venting, https://www.gore.com/products/categories/venting, accessed Oct. 12, 2022, 2022, 13 pages.
Itsenclosures, Product Catalog, 2009, 48 pages.
Itsenclosures, Standard Product Data Sheet, 2011, 18 pages.

(56) References Cited

OTHER PUBLICATIONS

Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation,Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* V. *Manufacturing Resources International, Inc.*, Memorandum Opinion re claim construction, Sep. 27, 2018, 16 pages.
*Civiq Smartscapes, LLC* V. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

\* cited by examiner

DISPLAY ASSEMBLIES WITH VENTS

CROSS-REFERENCE TO RELATED APPLICATIONS

This application claims the benefit of U.S. provisional patent application No. 63/226,314 filed Jul. 28, 2021, the disclosures of which are hereby incorporated by reference as if fully restated herein.

TECHNICAL FIELD

Exemplary embodiments relate generally to display assemblies with vents, such as for humidity and/or pressure control.

BACKGROUND AND SUMMARY OF THE INVENTION

The use of electronic displays, such as for advertising, in the out-of-home market has increased in popularity over recent years. Being located outdoors, such electronic displays are frequently exposed to harsh conditions, including, but not limited to, solar loading, extreme temperatures, precipitation, moisture, contaminants, vandalism, wildlife, and the like. To protect the electronic displays, and associated sensitive components, from such harsh conditions, it is known to place the electronic displays in ruggedized housings. Such housings may fully or partially seal the electronic displays and other associated sensitive components.

It is known to thermally manage such electronic display assemblies using ambient air and/or circulating gas. Such ambient air may pass through one or more open loop airflow pathways within the assembly, and may thermally interact with circulating gas in one or more closed loop airflow pathways within the assembly where such closed loop pathways are used to remove heat generated by the electronic display assemblies, such as at the backlight.

Such electronic display assemblies, particularly those which incorporate fully or partially sealed areas, sometimes experience moisture, such as in the form of humidity, within the interiors of such units, even within the fully or partially sealed area(s), as such area(s) are generally not 100% sealed in a gas impermeable manner. For example, such areas may be partially or fully sealed against contaminants above a given size (e.g., dust or other particulate) and/or liquids, or in accordance with various standards such as IP65, but may still permit at least some gaseous transfer. Such gaseous transfer may bring moisture with it, such as in the form of humidity, potentially resulting in the formation of condensation on interior surfaces of the assemblies. This may result in undesirable fogging or obfuscation of the displayed images, or water damage to sensitive electronic equipment to name some examples.

Additionally, it may be desirable to control air pressure within such electronic display assemblies for various reasons. This may include controlling bowing of electronic displays, wear and tear on seals, or forces experienced on other various sensitive items within the electronic display assemblies. For example, as electronic displays are increasing in size, the large display layers may be subject to bowing or other distortion based on air pressures encountered. In the case of liquid crystal displays, negative pressure on either side of the layer of liquid crystals may result in cell breach and/or color distortion, such as brown mura. As another example, repeated positive and negative net pressure on gaskets or other seals may result in damage overtime.

Therefore, what is needed is a system and method for providing selective venting of an electronic display assembly, such as for humidity and/or pressure control.

Systems and methods are disclosed herein which provide selective venting within an electronic display assembly, such as for humidity and/or pressure control. The electronic display assemblies may include one or more vents. Such vents may be installed within the assemblies in a manner which connects the vents between certain fully or partially sealed areas (hereinafter also the "closed loop areas") and an ambient environment. The vents may be configured to permit circulating gas within the closed loop areas with which the respective vent is connected to only enter, or only exit, the closed loop areas. This may be by design, or may be selectively controlled to operate in such a manner. In particular, as electronic display assemblies become better sealed, the need for ventilation may be required to prevent large pressure fluctuations or levels which may otherwise cause mechanical damage.

The vents may be positioned relative to one or more fan assemblies or other airflow features such that they are located within one or more areas normally experiencing net positive, or relatively high, air pressure of circulating gas within such closed loop areas, or within one or more areas normally experiencing net negative, or relatively low, air pressure of the circulating gas. In exemplary embodiments, the vents are placed within such high/positive air pressure areas and may be configured to vent circulating gas within the closed loop areas to the ambient environment, such as when experiencing certain net positive pressures and/or pressures above a certain threshold. In this manner, humidity or other moisture within the assemblies may be vented with the expelled circulating gas to reduce or eliminate such humidity or other moisture within the assemblies. Alternatively, or additionally, the vents placed within such low/negative air pressure areas may be configured to vent ambient air 32 from the ambient environment into the closed loop areas, such as when experiencing certain net negative pressures and/or pressures below a certain threshold. In this manner, air pressure within the closed loop areas may be raised to, or maintained at, net positive pressure and/or above a certain threshold or relative to other portions of the unit, such as to keep the electronic display layer in compression, to keep humidity and/or other particulate out of the closed loop areas, combinations thereof, or the like. Particularly in the case of liquid crystal displays, compression on the electronic display layer may help to prevent cell breach, brown mura, or other visual distortions. As another example, without limitation, such positive or higher pressures may assist with improving optical performance, such as by preventing distortion by bowing, for example without limitation, of any type or kind of electronic display layer. As yet another example, such positive or higher pressures may assist with driving humidity and other contaminates out of the units.

Opening and closing of the vents may be provided automatically by design of the vents, such as but not limited to, by way of one or more mechanical features of the vents which are designed to operated when experiencing particular absolute or relative pressures. Alternatively, or additionally, opening and closing of the vents may be controlled electronically by one or more controllers. Such opening and closing, by design or electronic operation, may be performed in response to various operating conditions, such as but not limited to, measurements from one or more humidity sensors, temperature sensors, pressure sensors, fan speed sensors, relative pressures experienced at the vents, absolute pressures experienced at the vents, combinations thereof, or the like. In this manner, the vents may be designed and/or controlled to reduce or eliminate condensation, control humidity, and/or maintain positive air pressure within the closed loop areas.

Alternatively, or additionally, the vents may be configured to naturally permit a certain amount of flow from a relatively high-pressure area to a relatively low-pressure area. For example, without limitation, the vents may comprise one or more openings and/or fluid passageways configured to permit various volumetric flow rates at various relative pressures.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
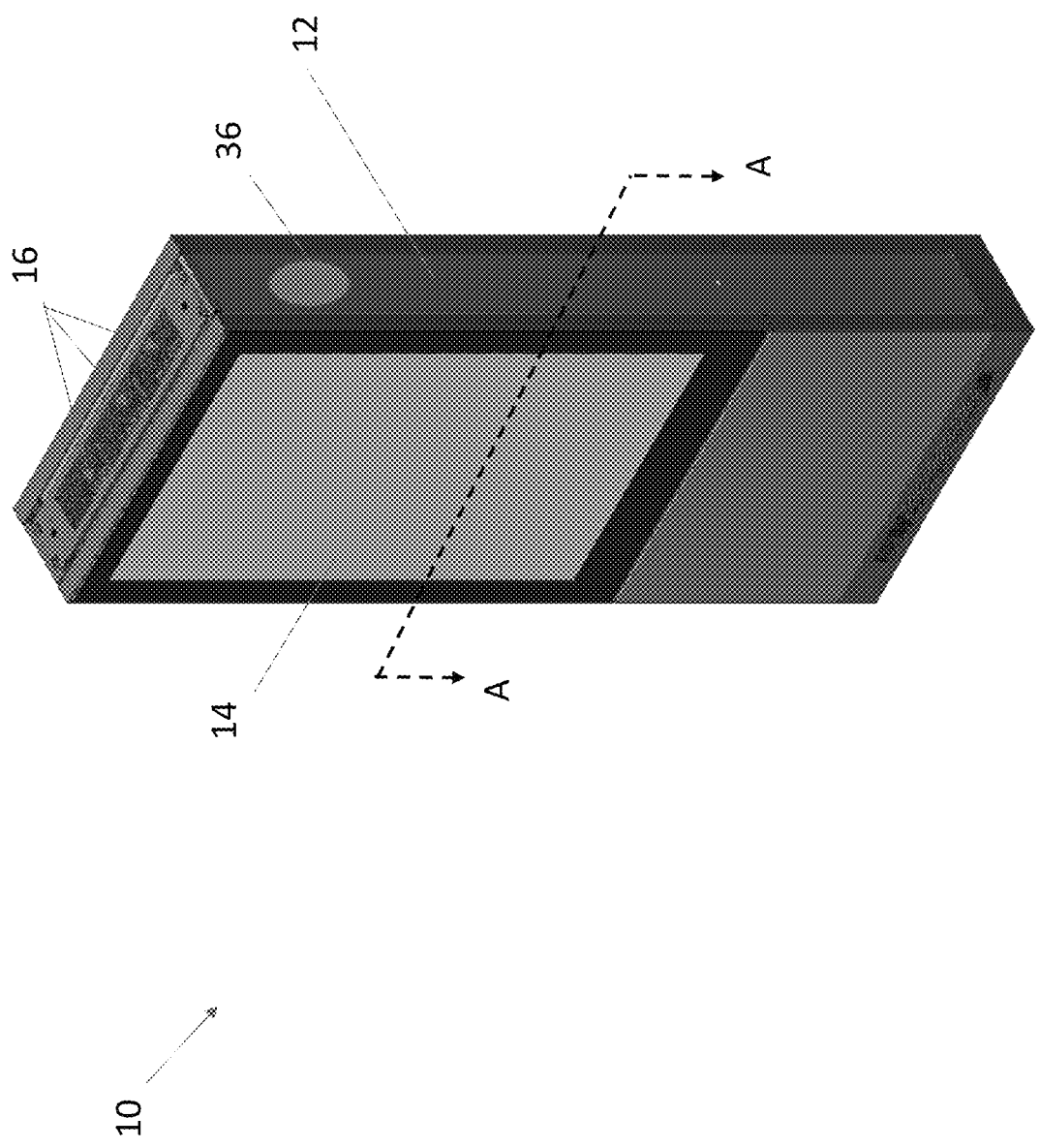
FIG. 1 is a perspective view of an exemplary electronic display assembly in accordance with the present invention also illustrating section line A-A.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, combinations thereof, or the like and may be configured to form a complete or partial housing. The structural framework 12 may form a full or partial housing for some or all components of the assembly 10.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework 12 in a hinged manner to permit selective movement between a closed position whereby certain parts of the units 10 are fully or partially sealed, and an open position whereby certain parts of the interior of the unit 10 are exposed for access. Full or partial sealing may be provided in accordance with one or more standards, such as but not limited to, ingress protection (IP) ratings provided by the International Electrotechnical Commission (e.g., available at https://www.iec.ch/ip-ratings), such as but not limited to, IP 63, 64, 65, 66, 67, and/or 68 by way of non-limiting example.

One or more intakes and exhausts 16 may be provided at the units 10 for ingesting and exhausting ambient air 32.

Figure 2:
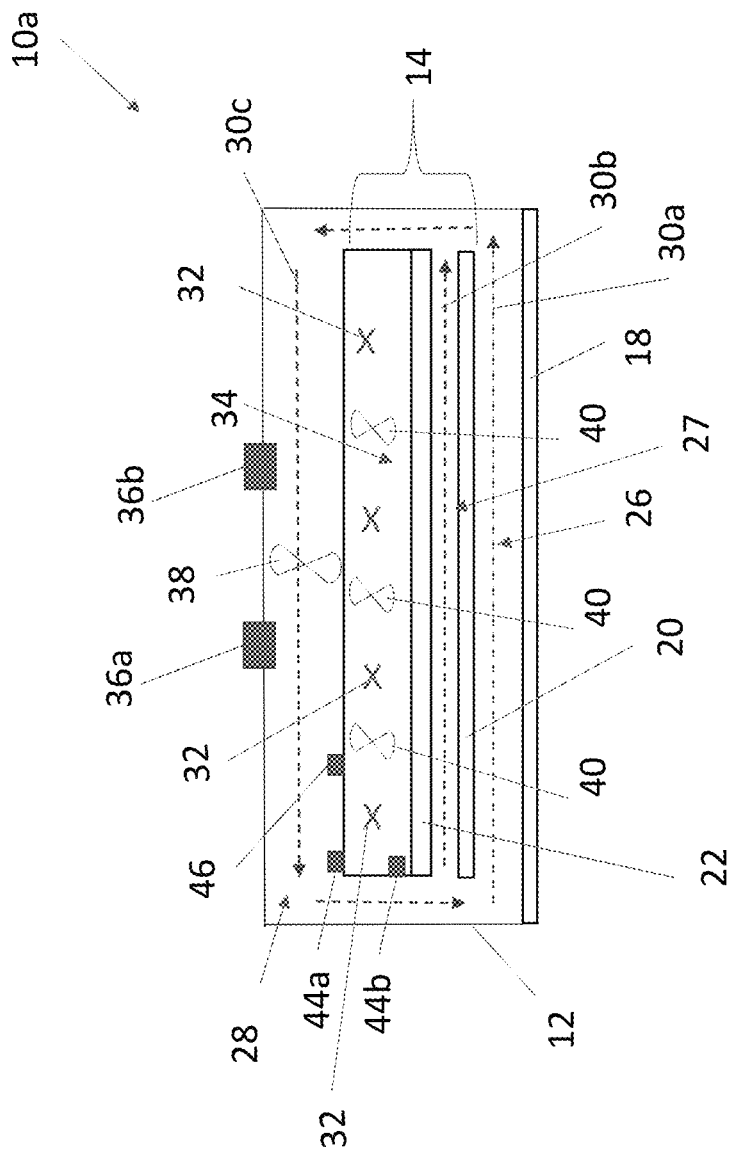
FIG. 2 is a simplified sectional view of an exemplary embodiment of the electronic display assembly of FIG. 1 taken along section line A-A.
Figure 3:
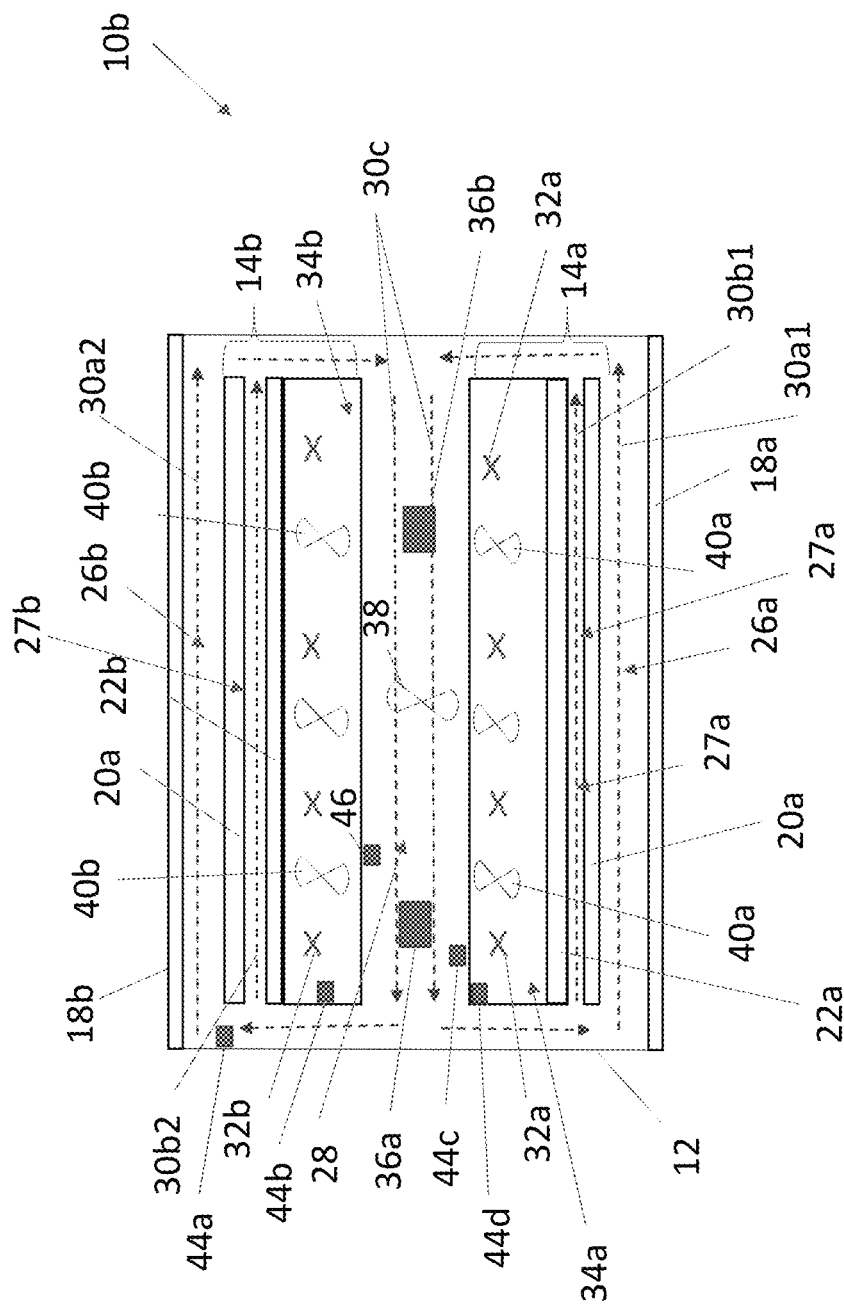
FIG. 3 is a simplified sectional view of another exemplary embodiment of the electronic display assembly of FIG. 1 taken along section line A-A.
Figure 4:
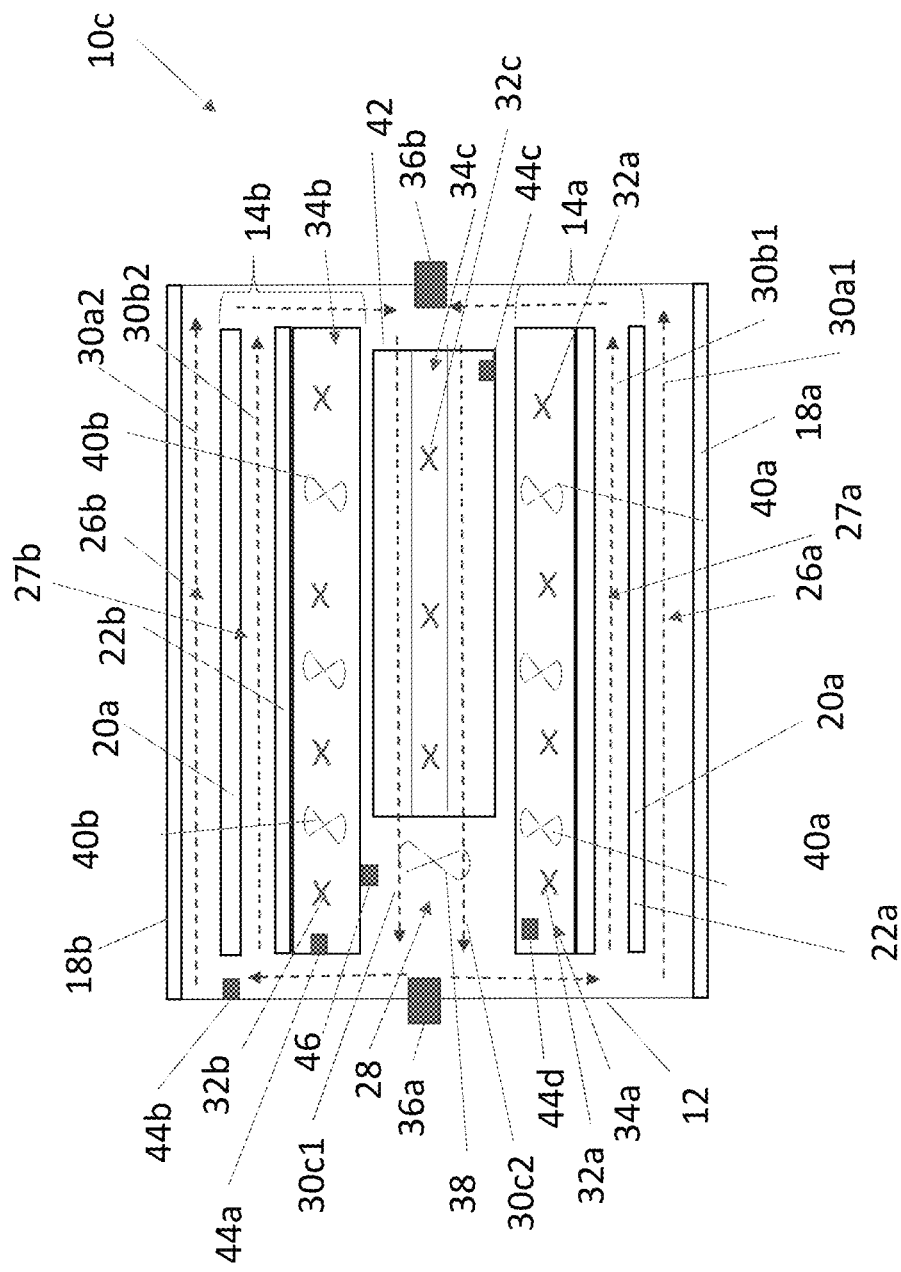
FIG. 4 is a simplified sectional view of another exemplary embodiment of the electronic display assembly of FIG. 1 taken along section line A-A.

FIG. 2 through FIG. 4 illustrate various exemplary embodiments of airflow pathways within the units 10. FIG. 2 illustrates an exemplary unit 10a with a single electronic display subassembly 14. FIGS. 3 and 4 illustrate exemplary units 10b, 10c with two electronic display subassemblies 14a, 14b placed in a back-to-back arrangement. Any number of electronic display subassemblies 14 may be utilized in any arrangement with the structural framework 12. Similar or the same components used in conjunction with units 10 having multiple electronic display subassemblies 14 may use the same numbering with the addition of an "a", "b", "c", and/or "1", "2", etc. (e.g., 14 to 14a, 14b, 30a to 30a1, 30a2).

Each electronic display subassembly 14 may comprise an electronic display layer 20. In exemplary embodiments, the electronic display layer 20 of each of the electronic display subassemblies 14 may comprise an LCD type display with a layer of liquid crystals, and each of the illumination devices 22 may comprise a direct backlight or edge lighting. However, other types of electronic display technologies may be utilized for such electronic display subassemblies 14 including, but not limited to, plasma displays, LED displays, OLED displays, rear projection, cathode ray tube, combinations thereof, or the like.

Each electronic display subassembly 14 may comprise an illumination device 22. In exemplary embodiments, the illumination device 22 may comprise a number of lighting elements, such as LEDs, provided at a substrate. In exemplary embodiments, the illumination device 22 may be provided rearward of the electronic display layer 20 to serve as a direct backlight. In other exemplary embodiments, the illumination device 22 may comprise one or more diffusive and/or transmissive layers and the substrate and/or lighting elements may be positioned about the edge of the electronic display layer 20 to provide edge lighting to the same. In certain exemplary embodiments, such as where the electronic display layer 20 is an LED, OLED, or other type of self-illuminating display, the illumination device 22 may not be required.

The electronic display layer 20 and/or illumination device 22 may be positioned rearward of a cover 18. The cover 18 may comprise one or more layers of a transparent or translucent material. In exemplary embodiments, each cover 18 may comprise two layers bonded with an optically clear adhesive. One or more polarizers, anti-reflective materials, combinations thereof, or the like may be disposed on some or all of the cover 18. The cover 18 may form part of the electronic display subassembly 14 or may be separate therefrom. The cover 18 and the structural framework 12 may together substantially enclose the units 10, such as with intakes/exhausts 16 exempted. The cover 18 may be configured to move with the electronic display subassembly 14, may be configured for independent movement, and/or may be fixed to the structural framework 12.

A single or multiple such electronic display subassemblies 14 may be provided at a single unit 10, such as but not limited to, in a back-to-back arrangement. The electronic display subassemblies 14 may be of the same or different type and may comprise the same or different components. The electronic display subassemblies 14 may be provided in any arrangement such as portrait or landscape.

The intakes and/or exhausts 16 may be fluidly connected to one or more open loop airflow pathways 34 within the units 10. A respective one of the open loop airflow pathways 34a, 34b may extend through a respective one of the electronic display subassemblies 14a, 14b in exemplary embodiments such that an open loop airflow pathway 34 is provided for each one of the electronic display subassemblies 14, which may be entirely separate or separated for a distance and rejoined. For example, without limitation, the open loop airflow pathways 34 may extend behind and along at least a portion of the illumination devices 22 for the electronic display layers 20 and/or behind and along at least a portion of the electronic display layers 20 itself, such as in the case of LED, OLED, or other self-illuminating display. The open loop airflow pathways 34 may comprise one or more corrugated layers in exemplary embodiments. However, any type, arrangement, and/or number of airflow pathway(s) may be utilized. One or more filters may be provided at the intakes and/or exhausts 16 and/or along the one or more open loop airflow pathways 34 within the units 10, though such is not necessarily required.

One or more closed loop airflow pathways may be provided within the units 10. In exemplary embodiments, such closed loop airflow pathways may comprise at least a front chamber 26, which may extend between the cover 18 and the electronic display layer 20, and a rear chamber 28, which may extend behind the electronic display subassembly 14, or at least the electronic display layer 20, but within the structural framework 12. Where multiple electronic display subassemblies 14a, 14b are utilized, the rear chamber 28 may be common to each of the electronic display subassemblies 14a, 14b. A heat exchanger 42 may be located within the rear chamber 28, though such is not required. The heat exchanger 42 may comprise a multilayer heat exchanger configured to accommodate a common flow 30c of the circulating gas through at least some of the layers as well as one or more flows 32c of ambient air through at least some other ones of the layers 34c. However, any type, arrangement, and/or number of airflow pathway(s) may be utilized. One or more filters may be provided at or along the one or more closed loop airflow pathways within the units 10, though such is not necessarily required. Filters, barriers, walls, gaskets, combinations thereof, or the like may provide separation between open and closed loop airflow pathways.

An illumination device chamber 27 may extend between each of the electronic display layers 20a, 20b and the respective illumination devices 22a, 22b. A flow of circulating gas 30c within the rear chamber 28 may be separated such that a first portion 30a flows through the front chamber 26 and a second portion 30b flows through the illumination device chamber 27. The flows 30a, 30b may be recombined, such as in the rear chamber 28.

One or more open loop fans 40 may be provided. The same of different open loop fans 40 may be associated with each of the open loop airflow pathways 34. The open loop fans 40 may be configured to ingest ambient air 32 into the units 10, exhaust ambient air 32 from the assembly 10, and/or move ingested ambient air 32 through the one or more open loop airflow pathways 34 when activated. One or more closed loop fans 38 may be provided. The same or different closed loop fans 38 may be associated with each of the closed loop airflow pathways. The closed loop fans 20 may be configured to move circulating gas through said one or more closed loop airflow pathways when activated. The fans 38, 40 may comprise axial fans, centrifugal fans, combinations thereof, or the like. Any number or type of fans 38, 40 may be used at any location in the units 10, and may be provided in banks or sets. The open loop airflow pathways 34 may be separate from the closed loop airflow pathways, though a complete (e.g., gas impermeable) separation is not necessarily required.

Examples of such airflow configurations and/or operations may include, for example without limitation, those shown and/or described in one or more of U.S. Pat. No. 8,854,595 issued Oct. 7, 2014, U.S. Pat. No. 8,767,165 issued Jul. 1, 2014, U.S. Pat. No. 8,654,302 issued Feb. 18, 2014, U.S. Pat. No. 8,351,014 issued Jan. 8, 2013, U.S. Pat. No. 10,660,245 issued May 19, 2020, U.S. Pat. No. 10,194,564 issued Jan. 29, 2019, and/or U.S. Pat. No. 10,398,066 issued Aug. 27, 2019, the disclosures of each of which are hereby incorporated by reference in their entireties. The structure and/or mechanical operation of the units 10, and the various components thereof, and/or airflow configurations may include those shown and/or described in U.S. Pat. No. 10,485,113 issued Nov. 19, 2019 (the "'133 Patent"), the disclosures of which are hereby incorporated by reference in their entirety. Movement and/or structure for facilitating movement of the electronic display subassemblies 14 may be as shown and/or described in at least the '133 Patent.

The unit 10 may comprise one or more controllers 46. The controller(s) 46 may comprise one or more programmable logic devices. The unit 10 may comprise one or more sensors 44. The sensors 44 may comprise, for example without limitation, temperature sensors, fan speed sensors, airflow sensors, humidity sensors, relatively humidity sensors, air pressure sensors, differential pressure sensors, location sensors, moisture sensors, combinations thereof, or the like. Any type, kind, or number of sensors 44 may be utilized at any number of locations within the units 10. The sensor(s) 44 may be in electronic communication with the controller(s) 46.

Each of the units 10 may comprise one or more vents 36. The vents 36 may be configured for one way operation, such as but not limited to, to only permit circulating gas to vent from a fluidly connected area of the closed loop airflow pathway(s) to the ambient environment, or only permit ambient air 32 from the ambient environment to vent into the fluidly connected area of the closed loop airflow pathway(s). However, two-way vents (ingestion and exhaustion) may alternatively, or additionally, be utilized. Opening and closing of the vents 36 may be configured to occur under certain conditions, such as but not limited to, at certain air pressures, by design and/or may be electronically controlled. For example, without limitation, the vents 36 may be configured to automatically open or close to permit ingestion of ambient air into the closed loop areas and/or exhaustion of circulating gas from the closed loop areas mechanically when experiencing certain conditions, such as but not limited to, certain relative pressure differences between ambient air and circulating gas and/or certain absolute pressures of ambient air and/or circulating gas, based on physical design and/or structure of the vent 36. Alternatively, or additionally, the vents 36 may be configured to be operated mechanically based on electronic command, such as but not limited to, by one or more motors.

In exemplary embodiments, each of the vents 36 may be connected to one or more areas of one or more closed loop airflow pathway(s) within the unit 10, and the ambient environment directly or to one of more of the open loop airflow pathways 34. Such connections may be direct, such as where the vent 36 extends between such environments, or indirect, such as by way of tubing or other fluid passageways. The vents 36 may connect to the ambient environment directly and/or by way of the one or more of the open loop airflow pathways 34.

Some or all of the vents 36 may be passive vents. The vents 36 may be configured to naturally permit flow of air from relatively high-pressure areas to relatively low-pressure areas. Some or all of the vents 36 may comprise fluid passageways such that the vents 36 are capable of selectively releasing circulating gas and/or ingesting ambient air. The size and/or shape of openings in and/or fluid passageways within the vents 36 may be configured to permit various volumetric flow rates at various relative pressures. The size and/or shape of openings in and/or fluid passageways within the vents 36 may be configured to naturally resist particulate and/or water ingestion. The vents 36 may optionally include one or more filters, membranes, or the like configured to resist or prevent particulate and/or water ingestion and/or permit one way flow of air.

Examples of such vents include, for example without limitation, those available from W. L. Gore & Associates, Inc. of Newark, DE (https://www.gore.com/products/categories/venting) and/or Amphenol Corp., of Wallingford, Ct. (https://www.amphenol.com/), including but not limited to the VEN-PS1NBK-08001 and/or VEN-PS1NBK-08002 products from Amphenol. These are merely exemplary and are not intended to be limiting.

In exemplary embodiments, a first one of the vents 36a may be placed on a first side of one of the closed loop fans 38 which may be associated with relatively high and/or net positive pressures when the fan 38 is operated. A second one of the vents 36b may be placed on a second side of one of the same or different ones of the closed loop fans 38, such as associated with relatively low and/or net negative pressures when the fan 38 is operated. In other exemplary embodiments, a single or multiple vents 36 may be placed exclusively on one side of the closed loop fans 38. Any number of vents 36 in any number of locations may be utilized. The vents 36 may be configured to ingest ambient air into, and/or exhaust circulating gas from, the associated closed loop areas. In exemplary embodiments, without limitation, one or more passive type vents 63 is placed in close proximity to a negative pressure side of the closed loop fans 38. In other exemplary embodiments, without limitation, one or more passive type vents 36 is placed in close proximity to a positive pressure side of the closed loop fans 38.

In exemplary embodiments, one or more of the vents 36 may be positioned on a side of the closed loop fans 38 associated with negative, or relatively low pressure primarily for ingesting ambient air into the associated closed loop area. In this manner, pressures within the closed loop airflow pathways, including the portions of the flow 30a and 30b within the front chamber 26 and the illumination devices chamber 27 may be raised to, and/or maintained at, positive pressures to place or keep the electronic display layer 20 in compression. This may prevent cell breach and/or color distortion.

Alternatively, or additionally, one or more of the vents 36 may be positioned on a side of the closed loop fans 38 associated with positive, or relatively high pressure primarily for exhausting circulating gas in the associated closed loop area to the ambient environment. In this manner, circulating gas may be periodically driven out of the closed loop areas. This may reduce or eliminate moisture and other contaminants. This may also maintain the electronic display layer 20 in tension, such as to keep it taught.

In exemplary embodiments, placement of, or at least selective opening of, one or more vents 36 on the side of the closed loop fans 38 associated with relatively high and/or net positive pressures when the fan 38 is operated may result in increasing the average pressure of the circulating gas in the associated closed loop area as compared to without such one or more vents 36 and/or keeping such one or more vents 36 closed. In exemplary embodiments, placement of, or at least selective opening of, one or more vents 36 on the side of the closed loop fans 38 associated with negative, or relatively low pressure when the fan 38 is operated may result in decreasing the average pressure of the circulating gas in the associated closed loop area as compared to without such one or more vents 36 and/or keeping such one or more vents 36 closed. In this manner, placement and/or operation of the vent(s) 36 may be controlled to control or influence pressures of circulating gas in the closed loop airflow pathway.

Alternatively, or additionally, the vent(s) 36 may be fluidly connected to such areas (e.g., those on the positive of negative side of the closed loop fans 38). Such fluid connection may be made by way of tubes, for example without limitation. This may permit the vent(s) 36 to be placed in more convenient locations and fluidly connected to the desired region, such as to accomplish the same, or substantially the same, effect while permitting greater design variation and/or where desired placement is impractical or impossible.

Figure 5:
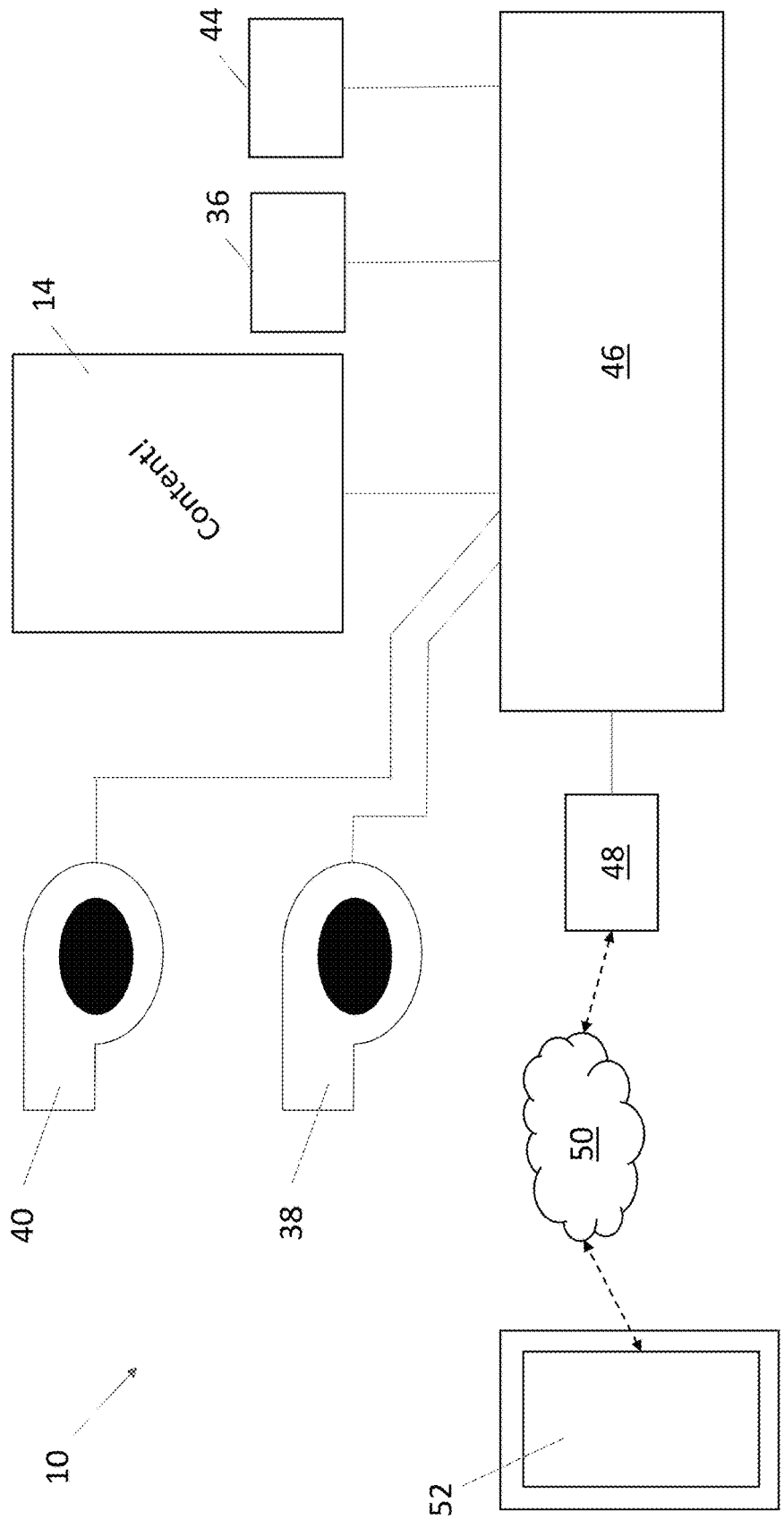
FIG. 5 is a simplified electrical schematic for use with the electronic display assembly of FIG. 1.

FIG. 5 is a simplified electrical schematic for use with the electronic display assembly 10. The controller 46 may be in electronic communication with some or all components of the assembly 10. The controller 46 may be in electronic communication with each of the electronic display subassemblies 14. The controller 46 may be in electronic communication with each of the closed loop fans 38. The controller 46 may be in electronic communication with each of the open loop fans 40. The controller 46 may be in electronic communication with each of the sensors 44. The controller 46 may be in electronic communication with each of the vents 36. The controller 46 may be configured to receive data from such components and/or send commands to such components by wired or wireless connection. For example, without limitation, the controller 46 may be configured to open or close the vents 36, control speeds of the fans 38, 40, content displayed at the electronic display subassemblies 14, take measurements from the sensors 44, combinations thereof, or the like. Such electronic communication is not required between the controller 46 and the aforementioned components. For example, without limitation, the vents 36 may be configured to operate based on experienced conditions (e.g., pressures) and without the need for electronic control.

The controller 46 may be in electronic communication with a network communication device 48. The network communication device 48 may be configured to receive data from the controller 46 for transmission over one or more networks 50 to one or more electronic devices 52, such as to permit remote monitoring of the units 10. The network communication device 48 may be configured to receive commands from the one or more electronic devices 52 for passing to the controller 46, such as to permit remote control over the units 10. The networks 50 may comprise cellular networks, wireless networks, wired networks, combinations thereof, or the like. The electronic devices 52 may comprise personal computers, smartphones, tablets, network operation centers, combinations thereof, or the like.

Figure 6:
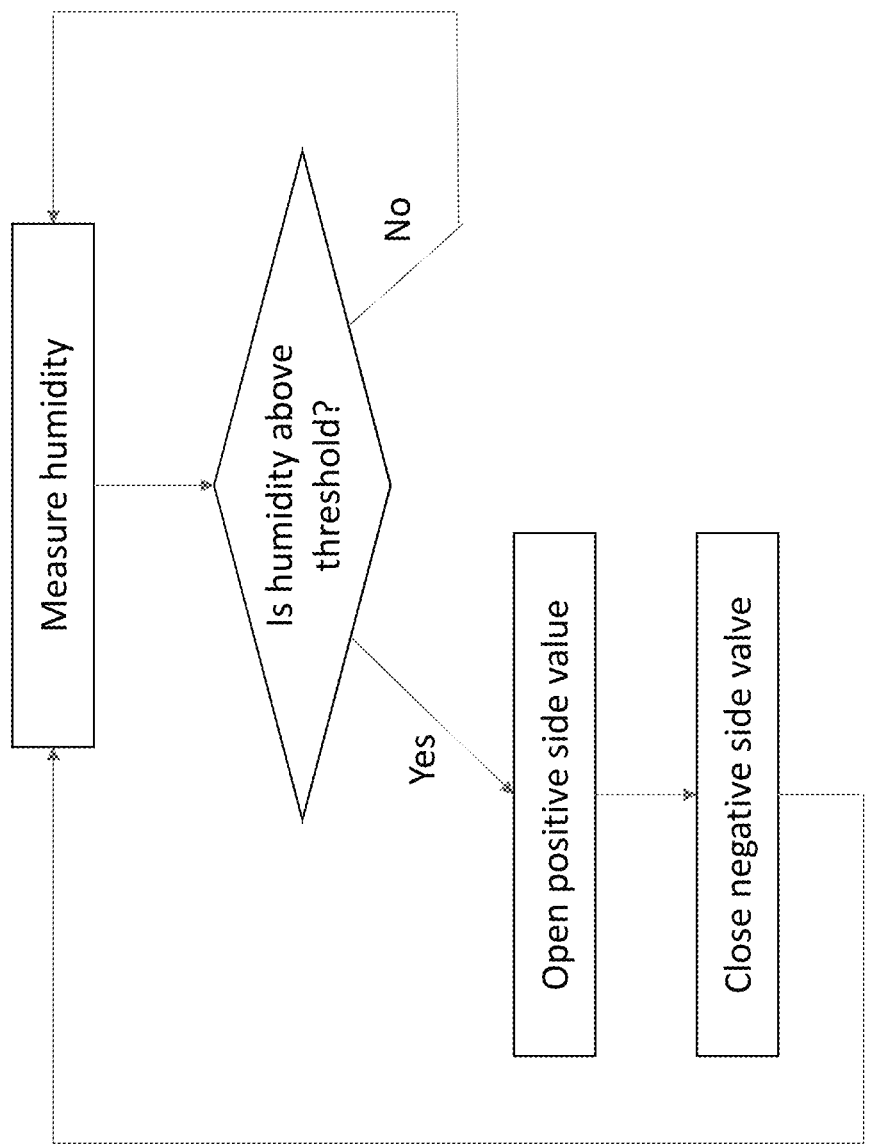
FIG. 6 is a flow chart with exemplary logic for operating the electronic display assembly of FIG. 5.

FIG. 6 is a flow chart with exemplary logic for operating the electronic display assembly 10. Humidity may be measured by way of at least one of the sensors 44, which may comprise a humidity sensor and/or relative humidity sensor (e.g., psychrometer). The measurement(s) may be reported to, or determined at, the controller 46 from data received from the at least one of the sensors 44. If the humidity is above a threshold, the controller 46 may be configured to open at least one of the vents 36. In exemplary embodiments, the controller 46 may be configured to open one or more of the vents 36 on a positive or relatively high-pressure side of one or more of the closed loop fans 38. The controller 46 may, alternatively or additionally, be configured to close one or more of the vents 36 on a negative or relatively low-pressure side of one or more of the closed loop fans 38. In other exemplary embodiments, the controller may be configured to open one or more of the vents 36 configured for one-way expulsion of circulating gas and/or close one or more of the vents configured for one-way ingestion of ambient air. Such operations may occur simultaneously or in sequence. This may permit expulsion of moisture from the units 10 with the expelled circulating gas. The threshold may be any amount. In exemplary embodiments, the threshold is set to reflect a point in which condensation is likely to form within the unit 10, with or without a margin of safety.

Figure 7:
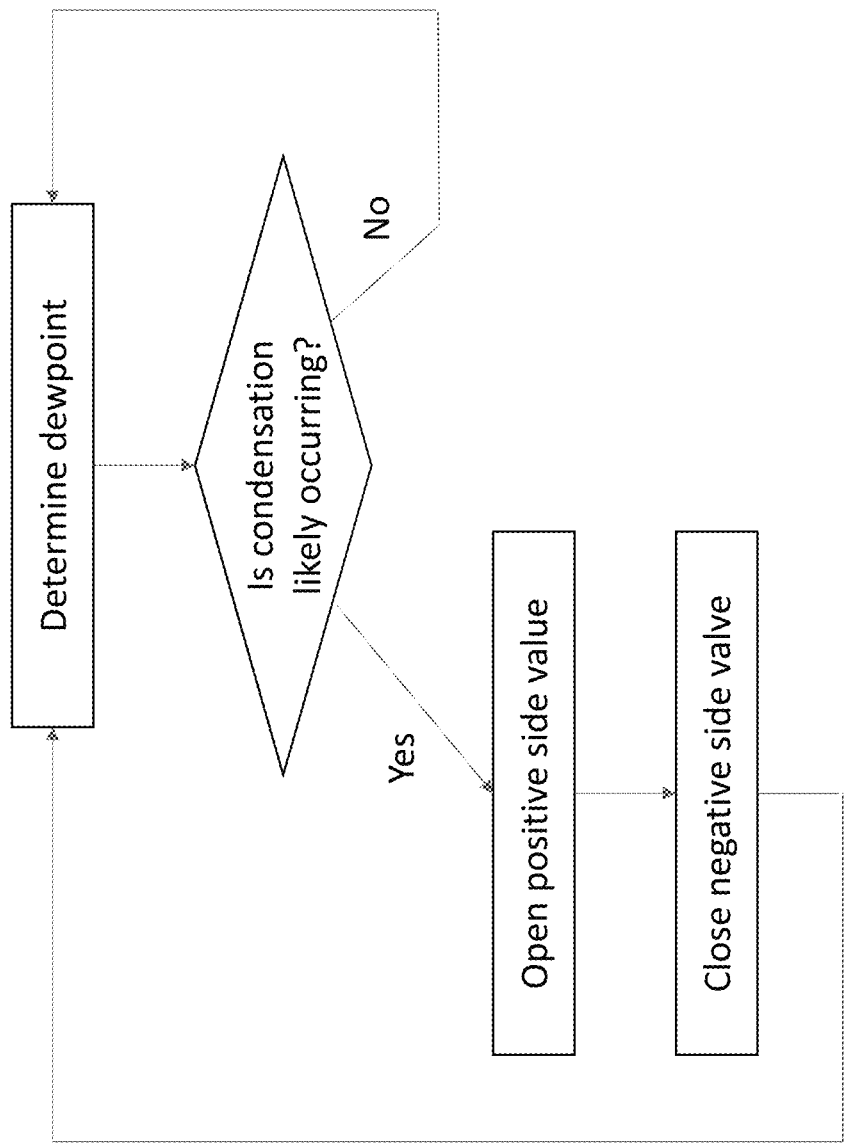
FIG. 7 is a flow chart with other exemplary logic for operating the electronic display assembly of FIG. 5.

FIG. 7 is a flow chart with other exemplary logic for operating the electronic display assembly 10. Relative humidity may be measured by way of at least one of the sensors 44. Air temperature may be measured by way of the same or different one(s) of the sensors 44. These measurements may be reported to, or determined at, the controller 46 from data received from the sensor(s) 44. Alternatively, or additionally, such measurements may be taken from one or more internet-based sources, such as by way of the network communication device 48. The controller 46 may be configured to determine a dewpoint for the measured air, which may be air within the units 10 or ambient, and calculate a dewpoint spread relative to the air temperature measurements, which may be ambient air within the units 10 or ambient air outside the units 10. In exemplary embodiments, dewpoint is calculated for circulating gas within the unit 10 and dewpoint spread is measured relative to ambient air outside of, or within, the units 10.

Where dewpoint spread reaches one or more thresholds, such as but not limited to within 5° C., the controller 46 may be configured to open one or more of the vents 36 on a positive or relatively high-pressure side of one or more of the closed loop fans 38. The controller 46 may, alternatively or additionally, be configured to close one or more of the vents 36 on a negative or relatively low-pressure side of one or more of the closed loop fans 38. Alternatively, or additionally, the controller 46 may be configured to operate such vents 36 in a manner which only permits circulating gas to be expelled from the unit 10 to ambient. Such operations may occur simultaneously or in sequence. In this manner, moisture may be expelled from the units 10 with the expelled circulating gas. The dewpoint spread threshold may be any amount.

Figure 8:
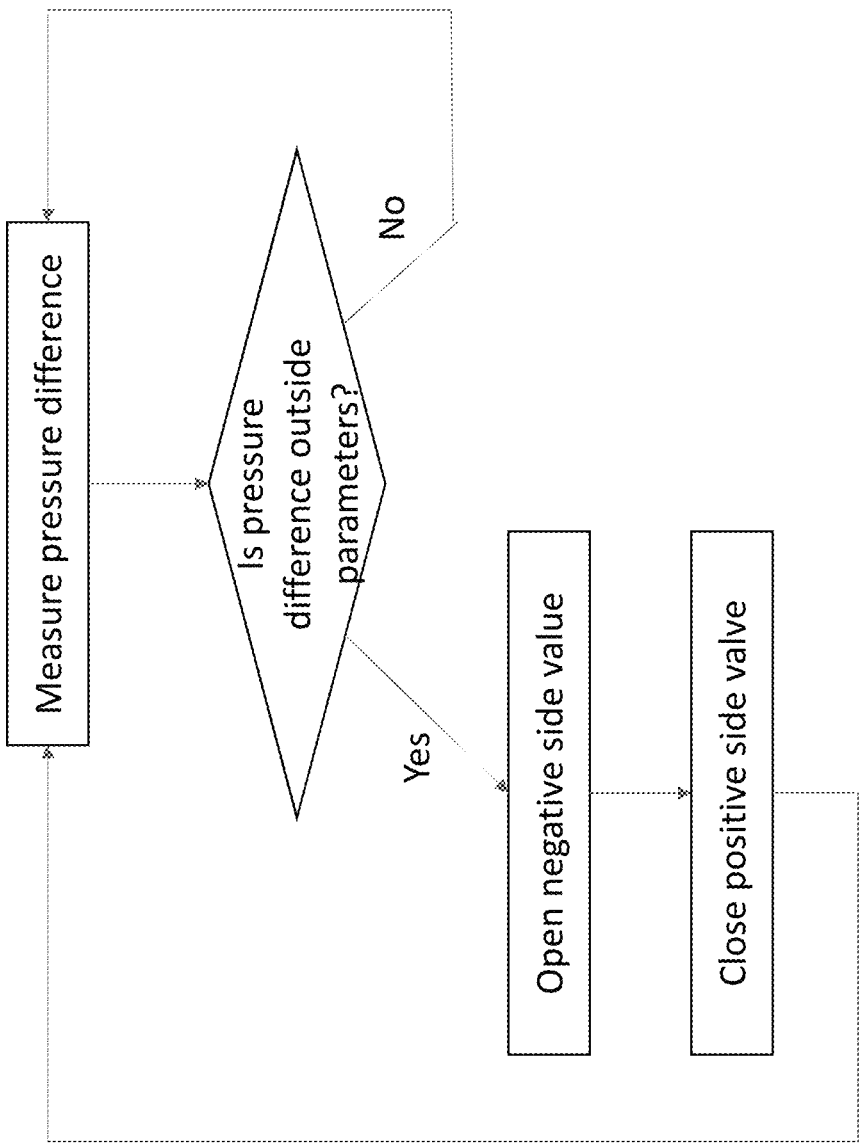
FIG. 8 is a flow chart with other exemplary logic for operating the electronic display assembly of FIG. 5.

FIG. 8 is a flow chart with other exemplary logic for operating the electronic display assembly 10. Air pressure readings of circulating gas, such as but not limited to, the portion 30a of circulating gas within the front chamber 26 and/or the portion 30b of the circulating gas within the illumination devices chamber 27 may be measured by way of one or more of the sensors 44. The measurements may be reported to, or determined at, the controller 46 from data received from the sensors 44. The controller 46 may be configured to determine if the pressures differential between the first and second portions 30a, 30b is within certain operating conditions. Such operating conditions may be, for example without limitation, both positive. Alternatively, or additionally, such operating conditions may be, without limitation, higher within the front chamber 26 relative within the illumination device chamber 27. These operating conditions may be configured to reduce or eliminate bowing of the electronic display layer 20, and/or maintain compressive forces on the electronic display layer 20. Where such pressure falls outside of desired conditions, the vents 36 may be selectively operated to control the same. For example, without limitation, one or more of the vents 36 associated with negative or relatively low pressure may be opened and/or configured for ingestion of ambient air so as to raise pressures within the closed loop airflow pathway.

While electronic control of the vents 36 is contemplated in at least certain embodiments, such as but not limited to, those shown and/or described with regard to FIGS. 5-8, the vents 36 may be configured to automatically operate by mechanical design in response to various conditions, such as pressures or relative pressures, experienced and thus such electronic control may not be required. The vents 36 may be configured, for example without limitation, to automatically operate mechanically by engineered deign and without physical control, in response to the conditions shown and/or described herein and/or achieve the results (e.g., humidity reduction, pressure miniatous) shown and/or described herein.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing device. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. An electronic display assembly with ventilation comprising:
   a structural framework;
   an electronic display subassembly attached to the structural framework and comprising a cover layer forming a forward surface of said electronic display subassembly and an electronic display layer located behind the cover layer;
   an enclosure for at least the electronic display layer, said enclosure defined, at least in part, by the structural framework and the cover layer;
   a closed loop airflow pathway extending within the enclosure; and
   one or more vents fluidly interposed between the closed loop airflow pathway and an ambient environment, wherein said one or more vents are movable between an open state and a closed state.

2. The electronic display assembly of claim 1 wherein:
   said one or more vents comprise openings and fluid passageways configured to permit gaseous flows at certain volumetric flow rates at certain pressures to the exclusion of gaseous flows at other volumetric flow rates and other pressures.

3. The electronic display assembly of claim 2 wherein:
   said one or more vents comprise one or more membranes configured to resist ingestion of particulate and water.

4. The electronic display assembly of claim 2 further comprising:
   at least one fan located along the closed loop airflow pathway, wherein the said one or more vents are located on a negative pressure side of the at least one fan.

5. The electronic display assembly of claim 1 further comprising:
   a controller in electronic communication with the one or more vents and configured to selectively and individually operate said one or more vents between the open state and the closed state.

6. The electronic display assembly of claim 5 further comprising:
   at least one fan located along the closed loop airflow pathway;
   a first one of the one or more vents located on a first side of said at least one fan associated with a positive pressure; and
   a second one of the one or more vents located on a second side of said at least one fan associated with a negative pressure.

7. The electronic display assembly of claim 5 further comprising:
   one or more sensors in electronic communication with said controller, wherein said controller is configured to operate said one or more vents between said open state and said closed state at least in part based on data received from said one or more sensors.

8. The electronic display assembly of claim 7 wherein:
   said one or more sensors comprise a differential pressure sensor fluidly connected to said closed loop airflow pathway and the ambient environment; and
   said controller is configured to operate the first one of said vents in said closed state and said second one of said vents in said open state after determining, based on data received from said differential pressure sensor, that a measured pressure difference is outside a target range.

9. The electronic display assembly of claim 7 wherein:
   said one or more sensors comprise a humidity sensor; and
   said controller is configured to operate the first one of said vents in said open state and said second one of said vents in said closed state after determining, based on data received from said differential pressure sensor, that a measured humidity is above a predetermined threshold.

10. The electronic display assembly of claim 7 wherein:
    said one or more sensors comprise a temperature sensor located at the closed loop airflow pathway; and
    said controller is configured to:
       measure a temperature of circulating gas within the closed loop airflow pathway by way of the temperature sensor;
       determine a dewpoint of the ambient environment;
       determine a dewpoint spread between the temperature and the dewpoint; and
       where the dewpoint spread is below a predetermined threshold:
          operate the first one of said vents in said open state; and
          operate the second one of said vents in said closed state.

11. The electronic display assembly of claim 1 wherein:
    a first portion of said closed loop airflow pathway extends between said cover and said electronic display layer, a second portion of said closed loop airflow pathway extends rearward of said electronic display layer;
    said electronic display layer comprises liquid crystals; and
    said electronic display subassembly comprises a backlight located rearward of the electronic display layer.

12. The electronic display assembly of claim 11 further comprising:
    a second electronic display subassembly attached to said structural framework, wherein the electronic display subassembly and the second electronic display subassembly are movably attached to opposing sides of said structural framework.

13. The electronic display assembly of claim 1 wherein:
    each of the one or more vents comprise one-way vents configured to permit exhaust of gas from the electronic display assembly.

14. An electronic display assembly with controllable ventilation, said electronic display assembly comprising:
    a structural framework;
    an electronic display subassembly attached to said structural framework and comprising a cover and an electronic display layer;

a closed loop airflow pathway for circulating gas extending within one or more of the structural framework and the electronic display subassembly;

a fan located along the closed loop airflow pathway;

a first controllable vent located on a first side of said fan and fluidly interposed between the closed loop airflow pathway and an ambient environment;

a second controllable vent located on a second side of said fan fluidly interposed between the closed loop airflow pathway and the ambient environment, wherein the first and second controllable vents comprise one-way vents configured to permit exhaust of the circulating gas from the closed loop airflow pathway to the ambient environment;

one or more sensors, at least one of which is located along the closed loop airflow pathway, wherein said one or more sensors are selected from the group consisting of: temperature sensors, humidity sensors, relatively humidity sensors, and pressure sensors; and a controller in electronic communication with the first and second controllable vents and the one or more sensors, wherein said controller is configured to separately operate said first and second controllable vents between an open state whereby the circulating gas is permitted to exit the closed loop airflow pathway to the ambient environment and a closed state whereby the circulating gas is prevented from exiting the closed loop airflow pathway to the ambient environment based on readings from said one or more sensors.

15. The electronic display assembly of claim 14 further comprising:

an open loop airflow pathway for ambient air extending within one or more of the structural framework and the electronic display subassembly, wherein said first and second controllable values are fluidly connected to the ambient environments by way of the open loop airflow pathway, and wherein at least one of said one or more sensors is located at the open loop airflow pathway.

16. A method for ventilating an electronic display assembly in a controllable fashion, said method comprising:

displaying images at an electronic display layer of said electronic display assembly;

operating a fan located along a closed loop airflow pathway of the electronic display assembly;

receiving data, at a controller, from a sensor located along the closed loop airflow pathway; and operably controlling, by way of the controller, a first vent located at a first side of said fan and a second vent located at a second side of the fan between an open state and a closed state, wherein each of said first and second vents are fluidly connected to said closed loop airflow pathway and an ambient environment.

17. The method of claim 16:

wherein said sensor comprises a differential pressure sensor fluidly connected to said closed loop airflow pathway and the ambient environment; and further comprising:

determining, at the controller by way of data received from the differential pressure sensor, that a measured differential pressure is outside a target range; and operating, by way of said controller, the first controllable vent in said closed state and said second controllable vent in said open state.

18. The method of claim 16:

wherein said sensor comprises a humidity sensor; and further comprising:

determining, at the controller by way of data received from the humidity sensor, that a measured humidity is above a predetermined threshold; and operating, by way of said controller, the first controllable vent in said open state and said second controllable vent in said closed state.

19. The method of claim 16:

wherein said sensor comprises a temperature sensor; and further comprising:

determining, at the controller, a dewpoint for the ambient environment;

determining, at the controller by way of data received from the temperature sensor, a dewpoint spread between the dewpoint and a measured temperature;

determining, at the controller, that the dewpoint spread is less than a predetermined threshold;

operating the first controllable vent in said open state; and operating the second controllable vent in said closed state.

20. The method of claim 19 wherein:

said dewpoint is determined based on data retrieved from one or more internet-based local weather information sources by way of one or more network communication devices in electronic communication with said controller.

* * * * *

UNITED STATES PATENT AND TRADEMARK OFFICE
CERTIFICATE OF CORRECTION

PATENT NO. : 12,408,312 B2
APPLICATION NO. : 17/872441
DATED : September 2, 2025
INVENTOR(S) : Mike Brown Page 1 of 1

It is certified that error appears in the above-identified patent and that said Letters Patent is hereby corrected as shown below:

On the Title Page

Item (56), References Cited, U.S. Patent Documents, please delete "7,212,403 B2 5/2007 Rockenfell" and insert -- 7,212,403 B2 5/2007 Rockenfeller --.

Item (56), References Cited, U.S. Patent Documents, please delete "2010/0226091 A1 9/2010 Punn" and insert -- 2010/0226091 A1 9/2010 Dunn --.

Item (56), References Cited, Foreign Patent Documents, please delete "JP IP6824440 B2 1/2021" and insert -- JP JP6824440 B2 1/2021 --.

Signed and Sealed this
Eleventh Day of November, 2025

John A. Squires
*Director of the United States Patent and Trademark Office*